US008952476B2

(12) United States Patent
Shimomura et al.

(10) Patent No.: US 8,952,476 B2
(45) Date of Patent: Feb. 10, 2015

(54) SOLID-STATE IMAGE PICKUP DEVICE

(71) Applicant: Kabushiki Kaisha Toshiba, Tokyo (JP)

(72) Inventors: Ai Shimomura, Yokohama (JP); Takanori Yagami, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 7 days.

(21) Appl. No.: 13/760,251

(22) Filed: Feb. 6, 2013

(65) Prior Publication Data
US 2014/0015024 A1 Jan. 16, 2014

(30) Foreign Application Priority Data

Jul. 13, 2012 (JP) .................................. 2012-157885

(51) Int. Cl.
*H01L 27/146* (2006.01)
(52) U.S. Cl.
CPC .... H01L 27/14643 (2013.01); H01L 27/14616 (2013.01); H01L 27/14641 (2013.01)
USPC .......................................... 257/444; 257/292
(58) Field of Classification Search
USPC .................. 257/431, 443, 444, 292, E21.122
See application file for complete search history.

(56) References Cited

U.S. PATENT DOCUMENTS

| 8,129,807 B2 * | 3/2012 | Nakagawa ..................... 257/435 |
| 2007/0040193 A1 * | 2/2007 | Ajiki ............................. 257/288 |
| 2013/0048999 A1 * | 2/2013 | Okazaki et al. ................. 257/59 |
| 2013/0328052 A1 * | 12/2013 | Kuo et al. ........................ 257/59 |
| 2014/0015024 A1 * | 1/2014 | Shimomura et al. .......... 257/292 |

FOREIGN PATENT DOCUMENTS

| JP | 2007-27601 | 2/2007 |
| JP | 2008-177306 | 7/2008 |
| JP | 2011-204916 | 10/2011 |
| KR | 10-2006-0114444 A | 11/2006 |

OTHER PUBLICATIONS

Office Action issued Jan. 16, 2014, in Korean Patent Application No. 10-2013-22822 with English translation.

* cited by examiner

*Primary Examiner* — Michael Shingleton
(74) *Attorney, Agent, or Firm* — Oblon, Spivak, McClelland, Maier & Neustadt, L.L.P.

(57) ABSTRACT

According to one embodiment, a solid-state image pickup device includes a photoelectric converter, transfer, reset and amplifier transistors and a floating diffusion layer formed on a semiconductor substrate. The photoelectric converter coverts incident light to a signal charge. The transfer transistor transfers the signal charge converted by the photoelectric converter. The floating diffusion layer stores the signal charge transferred by the transfer transistor. The reset transistor resets the signal charge stored in the floating diffusion layer. The amplifier transistor amplifies the signal charge stored in the floating diffusion layer. Source and drain regions of the reset transistor, and its channel region are formed in an L-shape on the semiconductor substrate.

4 Claims, 6 Drawing Sheets

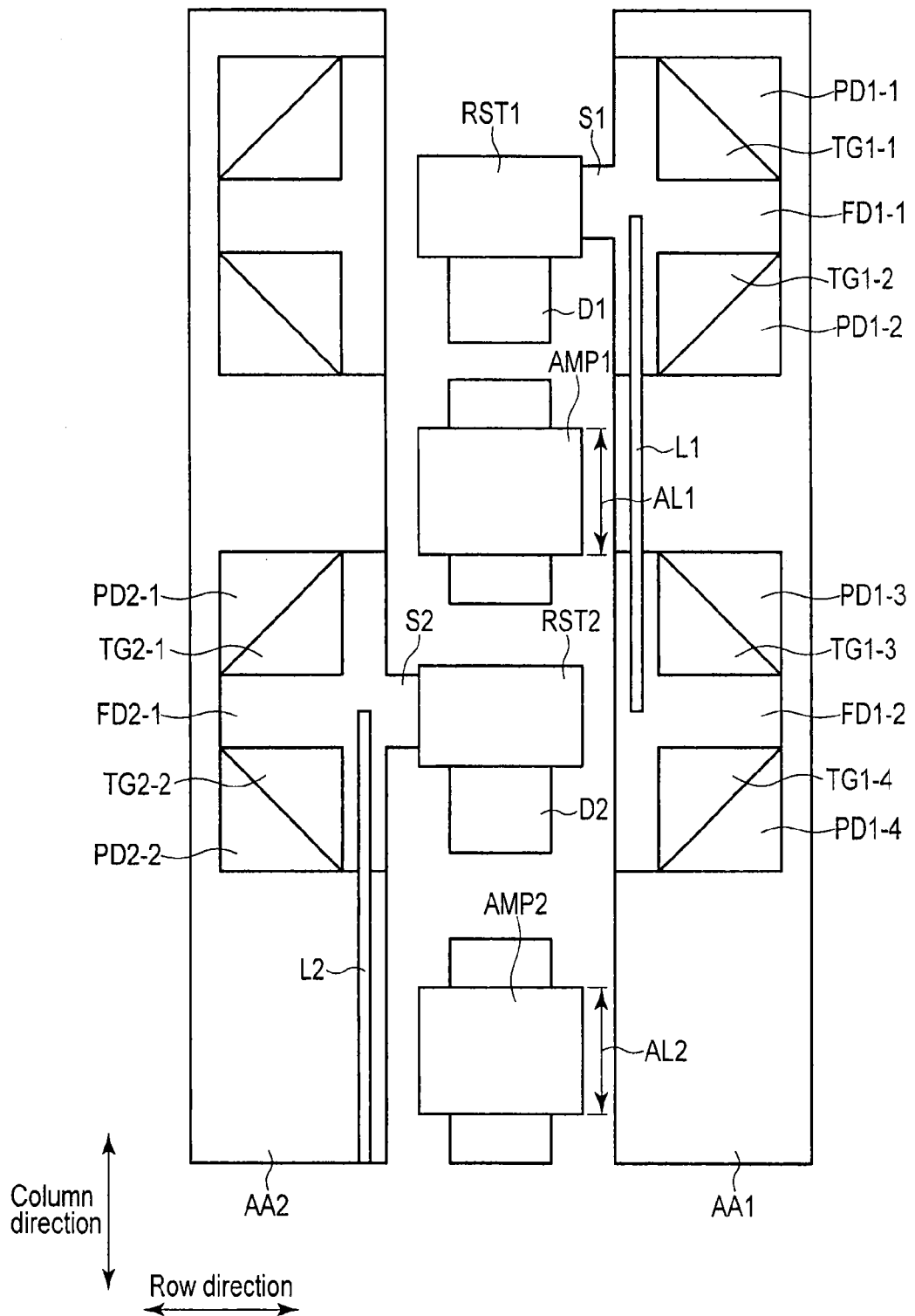
F I G. 1

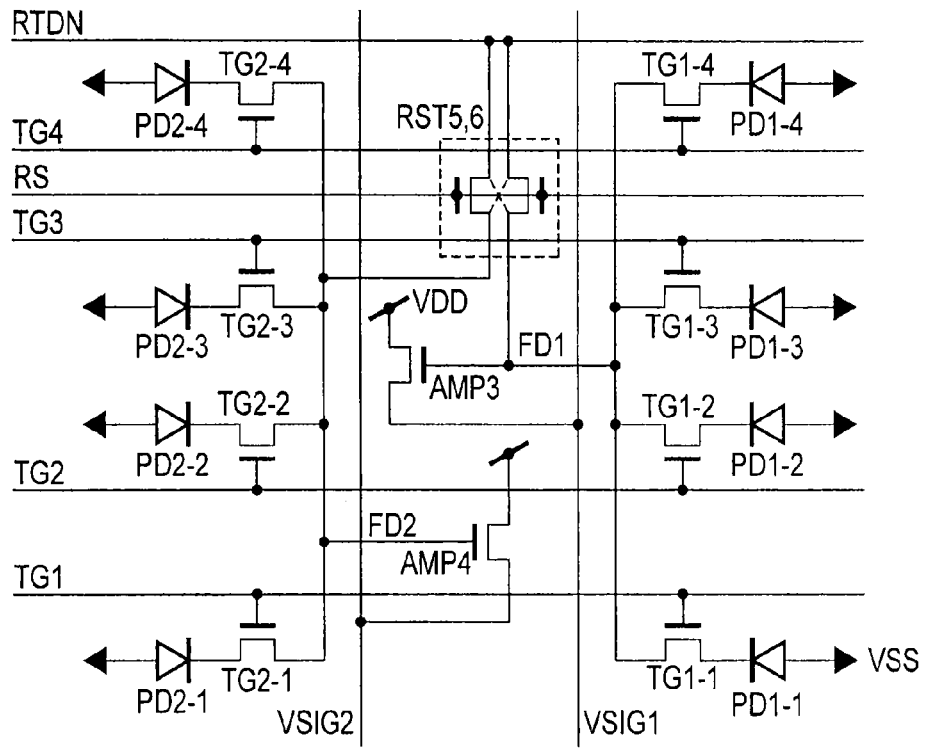
F I G. 10
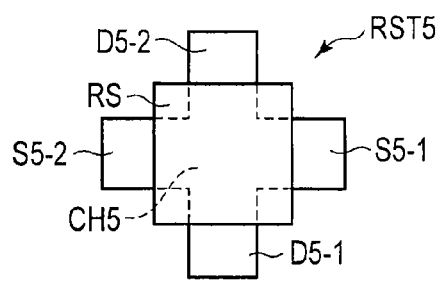
F I G. 11
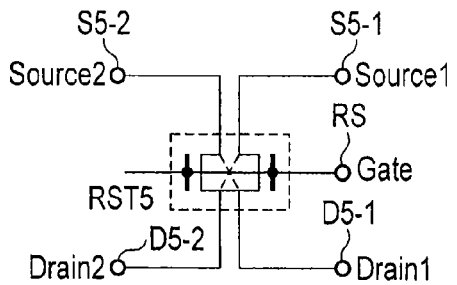
F I G. 12

SOLID-STATE IMAGE PICKUP DEVICE

CROSS-REFERENCE TO RELATED APPLICATIONS

This application is based upon and claims the benefit of priority from Japanese Patent Application No. 2012-157885, filed Jul. 13, 2012, the entire contents of which are incorporated herein by reference.

FIELD

Embodiments described herein relate generally to a solid-state image pickup device.

BACKGROUND

In a solid-state image pickup device, an effective design area is reduced along with pixel miniaturization, and it is therefore difficult to fulfill pixel characteristics only by shrinking the sizes of conventional photodiodes and transistors.

In order to achieve the miniaturization while fulfilling pixel characteristics, it is necessary not only to increase the degree of the sharing of pixels and reduce the number of transistors per pixel but also to efficiently arrange the photodiodes and the transistors.

BRIEF DESCRIPTION OF THE DRAWINGS

FIG. 1 is a layout diagram showing the configuration of a solid-state image pickup device according to a first embodiment;

FIG. 10 is a circuit diagram of the solid-state image pickup device according to the third embodiment;

FIG. 11 is a layout diagram of a reset transistor in the solid-state image pickup device according to the third embodiment; and FIG. 12 is a circuit diagram of the reset transistor in the solid-state image pickup device according to the third embodiment.

DETAILED DESCRIPTION

Figure 2:
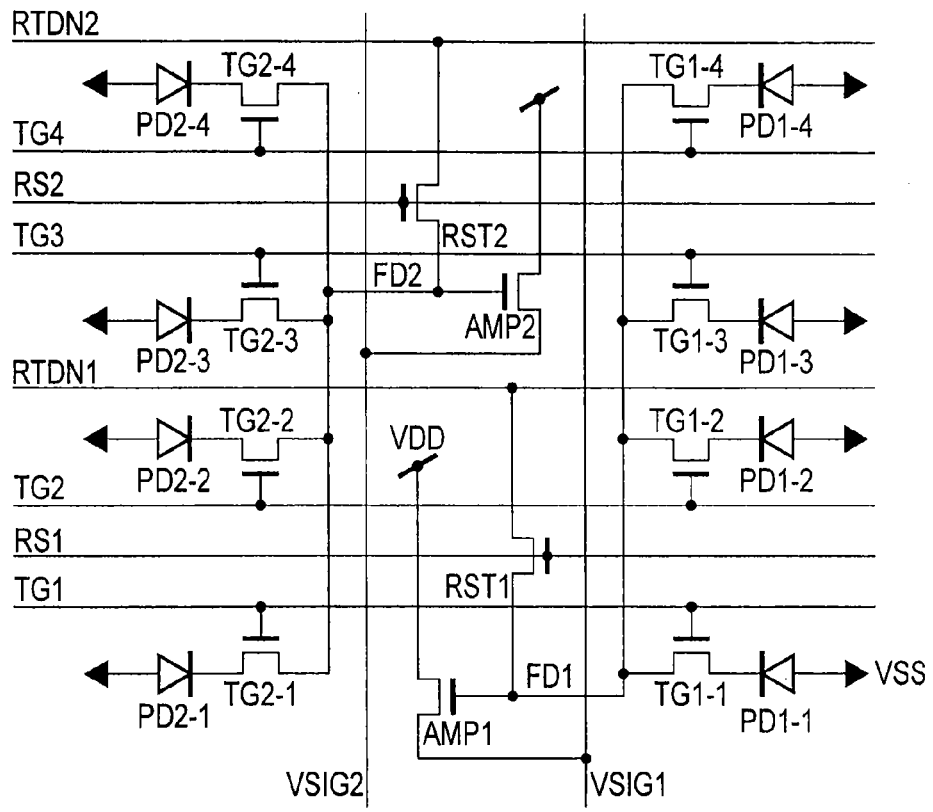
FIG. 2 is a circuit diagram of the solid-state image pickup device according to the first embodiment.

A solid-state image pickup device according to embodiments will be described hereinafter with reference to the drawings. In the following explanation, components having the same functions and configurations are provided with the same reference signs and are only repeatedly described when necessary.

In general, according to one embodiment, a solid-state image pickup device includes a first photoelectric converter, a transfer transistor, a first floating diffusion layer, a reset transistor and an amplifier transistor. The first photoelectric converter is formed on a semiconductor substrate and coverts incident light to a signal charge. The transfer transistor is formed on the semiconductor substrate and transfers the signal charge converted by the first photoelectric converter. The first floating diffusion layer is formed on the semiconductor substrate and stores the signal charge transferred by the transfer transistor. The reset transistor is formed on the semiconductor substrate and resets the signal charge stored in the first floating diffusion layer. The amplifier transistor is formed on the semiconductor substrate and amplifies the signal charge stored in the first floating diffusion layer. A source region and a drain region of the reset transistor, and its channel region between the source region and the drain region are formed in an L-shape on the semiconductor substrate.

First Embodiment

The solid-state image pickup device according to the first embodiment is described.

FIG. 1 is a layout diagram showing the configuration of a solid-state image pickup device according to the first embodiment.

As shown, active areas AA1 and AA2 are disposed on a semiconductor substrate. First and second cell units are formed in active areas AA1 and AA2.

The first cell unit includes photoelectric converters such as photodiodes PD1-1, PD1-2, PD1-3, and PD1-4, transfer transistors TG1-1, TG1-2, TG1-3, and TG1-4, an amplifier transistor AMP1, a reset transistor RST1, and floating diffusions (floating diffusion layers) FD1-1 and FD1-2.

The first cell unit has the following configuration. Photodiodes PD1-1 and PD1-2 are disposed in a column direction in active area AA1. Transfer transistor TG1-1 is disposed in the vicinity of photodiode PD1-1. Transfer transistor TG1-2 is disposed in the vicinity of photodiode PD1-2. Moreover, floating diffusion FD1-1 is disposed between transfer transistors TG1-1 and TG1-2.

Reset transistor RST1 is disposed in the vicinity of floating diffusion FD1-1 in a row direction. Amplifier transistor AMP1 is disposed in the vicinity of reset transistor RST1 in the column direction.

A source region S1 and a drain region D1 of reset transistor RST1, and its channel region between source region S1 and drain region D1 are formed in an L-shape. This source region S1 is connected to floating diffusion FD1-1, and source region S1 is shared with floating diffusion FD1-1. That is, source region S1 and floating diffusion FD1-1 are formed from a common diffusion region.

Photodiodes PD1-3 and PD1-4 are disposed in the column direction of photodiode PD1-2. Transfer transistor TG1-3 is disposed in the vicinity of photodiode PD1-3. Transfer transistor TG1-4 is disposed in the vicinity of photodiode PD1-4. Moreover, floating diffusion FD1-2 is disposed between transfer transistors TG1-3 and TG1-4.

An interconnect L1 is disposed between floating diffusions FD1-1 and FD1-2 to connect these floating diffusions.

The second cell unit is disposed in the row direction of photodiodes PD1-3 and PD1-4.

The second cell unit includes photoelectric converters such as photodiodes PD2-1, PD2-2, PD2-3, and PD2-4, transfer transistors TG2-1, TG2-2, TG2-3, and TG2-4, an amplifier transistor AMP2, a reset transistor RST2, and floating diffusions FD2-1 and FD2-2. In FIG. 1, photodiodes PD2-3 and PD2-4, transfer transistors TG2-3 and TG2-4, and floating diffusion FD2-2 are not shown.

The second cell unit has the following configuration. Photodiodes PD2-1 and PD2-2 are disposed in the column direction in active area AA2. Transfer transistor TG2-1 is disposed in the vicinity of photodiode PD2-1. Transfer transistor TG2-2 is disposed in the vicinity of photodiode PD2-2. Moreover, floating diffusion FD2-1 is disposed between transfer transistors TG2-1 and TG2-2.

Reset transistor RST2 is disposed in the vicinity of floating diffusion FD2-1 in the row direction. Amplifier transistor AMP2 is disposed in the vicinity of reset transistor RST2 in the column direction.

A source region S2 and a drain region D2 of reset transistor RST2, and its channel region between source region S2 and drain region D2 are formed in an L-shape. This source region S2 is connected to floating diffusion FD2-1, and source region S2 is shared with floating diffusion FD2-1. That is, source region S2 and floating diffusion FD2-1 are formed from a common diffusion region.

Photodiodes PD2-3 and PD2-4, transfer transistors TG2-3 and TG2-4, and floating diffusion FD2-2 are disposed in the column direction of photodiode PD2-2, but are not shown here. An interconnect L2 is disposed between floating diffusion FD2-1 and floating diffusion FD2-2 to connect these floating diffusions.

In the layout diagram shown in FIG. 1, source region S1, the channel region, and drain region D1 of reset transistor RST1 are formed in an L-shape, that is, source region S1 and drain region D1 are formed to intersect at right angles with each other. Therefore, there is no source region in a region that faces the drain region of reset transistor RST1. By using the region without the source region to form the amplifier transistor, the gate length of the amplifier transistor can be greater. This can reduce the random noise of a signal charge output from the amplifier transistor.

Similarly, source region S2, the channel region, and drain region D2 of reset transistor RST2 are formed in an L-shape. Therefore, there is no source region in a region that faces the drain region of reset transistor RST2. By using the region without the source region to form amplifier transistor AMP1, gate length AL1 of amplifier transistor AMP1 can be greater. This can reduce the random noise of a signal charge output from amplifier transistor AMP1.

Similarly, gate length AL2 of amplifier transistor AMP2 can be greater, so that the random noise of a signal charge output from amplifier transistor AMP2 can be reduced.

Source region S1, the channel region, and drain region D1 of reset transistor RST1 are formed in an L-shape so that source region S1 of reset transistor RST1 is shared with floating diffusion FD1-1. Accordingly, the area of the diffusion region including source region S1 and floating diffusion FD1-1 can be reduced, and the capacity of the diffusion region can be reduced. As a result, the conversion gain in the floating diffusion can be increased. In addition, low noise can be improved.

Now, the circuit configuration of the solid-state image pickup device according to the first embodiment is described.

FIG. 2 is a circuit diagram of the solid-state image pickup device according to the first embodiment.

The cathode of photodiode PD1-1 is connected to floating diffusion FD1 (FD1-1 and FD1-2) via the current path of transfer transistor TG1-1. The cathode of photodiode PD1-2 is connected to floating diffusion FD1 via the current path of transfer transistor TG1-2. The cathode of photodiode PD1-3 is connected to floating diffusion FD1 via the current path of transfer transistor TG1-3. The cathode of photodiode PD1-4 is connected to floating diffusion FD1 via the current path of transfer transistor TG1-4.

Floating diffusion FD1 is in a floating state when transfer transistors TG1-1 to TG1-4 and reset transistor RST1 are off.

Floating diffusion FD1 is connected to the gate of amplifier transistor AMP1 and to one end of the current path of reset transistor RST1. The other end of the current path of reset transistor RST1 is connected to a signal line RTDN1. One end of the current path of amplifier transistor AMP1 is connected to a signal line VSIG1. Moreover, the other end of the current path of amplifier transistor AMP1 is connected to a power supply voltage VDD.

The gates of transfer transistors TG1-1, TG1-2, TG1-3, and TG1-4 are connected to signal lines TG1, TG2, TG3, and TG4, respectively. A signal line RS1 is connected to the gate of reset transistor RST1. Moreover, a reference potential, for example, a ground potential Vss is supplied to the anodes of photodiodes PD1-1, PD1-2, PD1-3, and PD1-4.

The cathode of photodiode PD2-1 is connected to floating diffusion FD2 (FD2-1 and FD2-2) via the current path of transfer transistor TG2-1. The cathode of photodiode PD2-2 is connected to floating diffusion FD2 via the current path of transfer transistor TG2-2. The cathode of photodiode PD2-3 is connected to floating diffusion FD2 via the current path of transfer transistor TG2-3. The cathode of photodiode PD2-4 is connected to floating diffusion FD2 via the current path of transfer transistor TG2-4.

Floating diffusion FD2 is in a floating state when transfer transistors TG2-1 and TG2-4 and reset transistor RST2 are off.

Floating diffusion FD2 is connected to the gate of amplifier transistor AMP2 and to one end of the current path of reset transistor RST2. The other end of the current path of reset transistor RST2 is connected to a signal line RTDN2. One end of the current path of amplifier transistor AMP2 is connected to a signal line VSIG2. Moreover, the other end of the current path of amplifier transistor AMP2 is connected to a power supply voltage VDD.

The gates of transfer transistors TG2-1, TG2-2, TG2-3, and TG2-4 are connected to signal lines TG1, TG2, TG3, and TG4, respectively. A signal line RS2 is connected to the gate of reset transistor RST2. Moreover, a reference potential, for example, a ground potential Vss is supplied to the anodes of photodiodes PD2-1, PD2-2, PD2-3, and PD2-4.

Now, the reset transistor in the solid-state image pickup device according to the first embodiment is described in detail.

Figure 3:
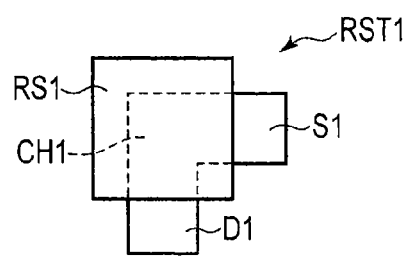
FIG. 3 is a layout diagram of a reset transistor in the solid-state image pickup device according to the first embodiment.
Figure 4:
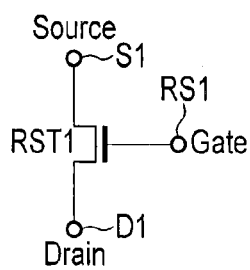
FIG. 4 is a circuit diagram of the reset transistor in the solid-state image pickup device according to the first embodiment.

FIG. 3 is a layout diagram of the reset transistor, and FIG. 4 is a circuit diagram of the reset transistor. Although the layout and circuit diagram of reset transistor RST1 are described here, reset transistor RST2 only has different reference signs and is similar in configuration.

In the active area of the semiconductor substrate, source region S1, drain region D1, and a channel region CH1 between source region S1 and drain region D1 are laid out in L-shaped, as shown in FIG. 3. Moreover, signal line RS1 as a gate electrode is disposed on channel region CH1.

The circuit diagram of reset transistor RST1 in which source region S1, channel region CH1, and drain region D1 are thus formed in an L-shape is shown in FIG. 4. The circuit diagram of reset transistor RST1 is similar to that of a normal transistor, and reset transistor RST1 is similar in function to the normal transistor.

The advantageous effects of the solid-state image pickup device according to the first embodiment are described below in detail.

A source region, a channel region, and a drain region of a conventional reset transistor are formed in a linear form. In contrast, according to the first embodiment, the source region, the channel region, and the drain region of the reset transistor are formed in an L-shape so that the source region of the reset transistor is shared with the floating diffusion. Accordingly, the area of the diffusion region including the source region and the floating diffusion can be reduced, and the capacity of the diffusion region can be reduced. As a result, the conversion gain in the floating diffusion can be increased. In addition, low noise can be improved.

Furthermore, the source region is shared with the floating diffusion, and it is thereby possible to eliminate the source region disposed in the region that faces the drain region across the gate electrode. The region in which this source region has been formed is used to form the amplifier transistor so that the gate length of the amplifier transistor is greater. This can reduce the random noise of a signal charge output from the amplifier transistor.

Second Embodiment

In the first embodiment described above, the source region, the channel region, and the drain region of the reset transistor are L-shaped. In the example described in the second embodiment, source regions, a channel region, and a drain region of a reset transistor are T-shaped.

Figure 5:
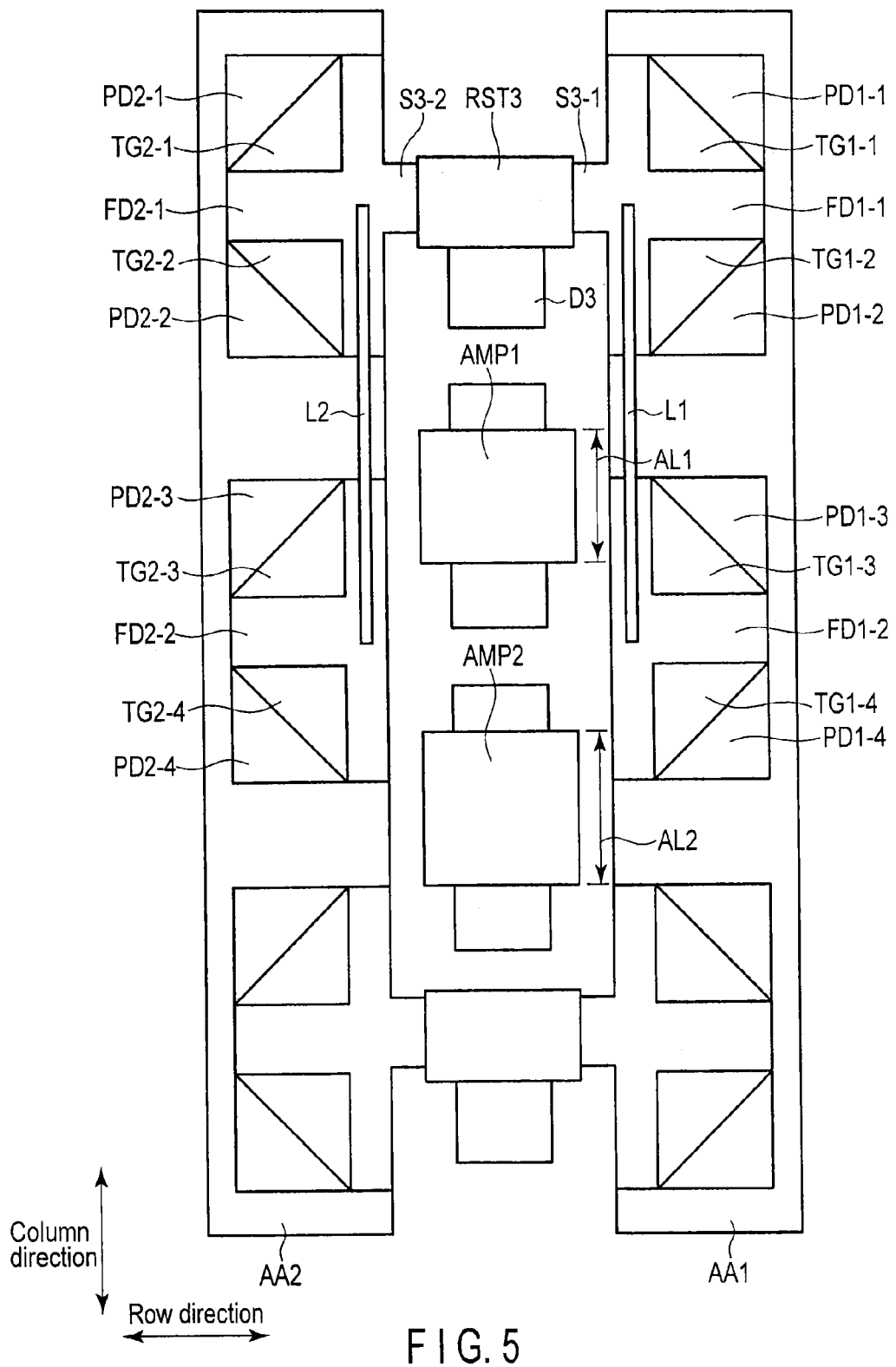
FIG. 5 is a layout diagram showing the configuration of a solid-state image pickup device according to a second embodiment.

FIG. 5 is a layout diagram showing the configuration of a solid-state image pickup device according to the second embodiment.

As shown, active areas AA1 and AA2 are disposed on a semiconductor substrate. First and second cell units are formed in active areas AA1 and AA2.

The first cell unit includes photodiodes PD1-1, PD1-2, PD1-3, and PD1-4, transfer transistors TG1-1, TG1-2, TG1-3, and TG1-4, an amplifier transistor AMP1, a reset transistor RST3, and floating diffusions FD1-1 and FD1-2.

The first cell unit has the following configuration. Photodiodes PD1-1 and PD1-2 are disposed in a column direction in active area AA1. Transfer transistor TG1-1 is disposed in the vicinity of photodiode PD1-1. Transfer transistor TG1-2 is disposed in the vicinity of photodiode PD1-2. Moreover, floating diffusion FD1-1 is disposed between transfer transistors TG1-1 and TG1-2.

Reset transistor RST3 is disposed in the vicinity of floating diffusion FD1-1 in a row direction. Amplifier transistor AMP1 is disposed in the vicinity of reset transistor RST3 in the column direction.

Photodiodes PD1-3 and PD1-4 are disposed in the column direction of photodiode PD1-2. Transfer transistor TG1-3 is disposed in the vicinity of photodiode PD1-3. Transfer transistor TG1-4 is disposed in the vicinity of photodiode PD1-4. Moreover, floating diffusion FD1-2 is disposed between transfer transistors TG1-3 and TG1-4.

An interconnect L1 is disposed between floating diffusions FD1-1 and FD1-2 to connect these floating diffusions.

The second cell unit is disposed in the row direction of the first cell unit. The second cell unit includes photodiodes PD2-1, PD2-2, PD2-3, and PD2-4, transfer transistors TG2-1, TG2-2, TG2-3, and TG2-4, an amplifier transistor AMP2, reset transistor RST3, and floating diffusions FD2-1 and FD2-2.

The second cell unit has the following configuration. Photodiodes PD2-1 and PD2-2 are disposed in the column direction in active area AA2. Transfer transistor TG2-1 is disposed in the vicinity of photodiode PD2-1. Transfer transistor TG2-2 is disposed in the vicinity of photodiode PD2-2. Moreover, floating diffusion FD2-1 is disposed between transfer transistors TG2-1 and TG2-2.

The above-mentioned reset transistor RST3 is disposed in the vicinity of floating diffusion FD2-1 in the row direction. That is, reset transistor RST3 is disposed between floating diffusion FD1-1 and floating diffusion FD2-1.

Source regions S3-1 and S3-2 and a drain region D3 of reset transistor RST3, and its channel region between source regions S3-1 and S3-2 and drain region D3 are formed in a T-shape. Source region S3-1 is connected to floating diffusion FD1-1, and source region S3-2 is connected to floating diffusion FD2-1. Source region S3-1 is shared with floating diffusion FD1-1, and source region S3-2 is shared with floating diffusion FD2-1. That is, source region S3-1 and floating diffusion FD1-1 are formed from a common diffusion region, and source region S3-2 and floating diffusion FD2-1 are formed from a common diffusion region.

Source regions S3-1 and S3-2 of reset transistor RST3 are disposed to face each other across the gate of reset transistor RST3. Further, a straight line that connects source regions S3-1 and S3-2 of reset transistor RST3, and drain region D3 form the T-shape.

Photodiodes PD2-3 and PD2-4 are disposed in the column direction of photodiode PD2-2. Transfer transistor TG2-3 is disposed in the vicinity of photodiode PD2-3. Transfer transistor TG2-4 is disposed in the vicinity of photodiode PD2-4. Moreover, floating diffusion FD2-2 is disposed between transfer transistors TG2-3 and TG2-4.

An interconnect L2 is disposed between floating diffusions FD2-1 and FD2-2 to connect these floating diffusions.

In the layout diagram shown in FIG. 5, source regions S3-1 and S3-2, the channel region, and drain region D3 of reset transistor RST3 are formed in the T-shape. That is, source regions S3-1 and S3-2 and drain region D3 are formed to intersect at right angles with each other, and source regions S3-1 and S3-2 are formed to face each other across the gate. Therefore, there is no source region in a region that faces drain region D3 of reset transistor RST3. By using the region without the source region to form the amplifier transistor, the gate length of the amplifier transistor can be greater. This can reduce the random noise of a signal charge output from the amplifier transistor.

Source regions S3-1 and S3-2, the channel region, and drain region D3 of reset transistor RST3 are formed in the T-shape so that source regions S3-1 and S3-2 of reset transistor RST3 are shared with floating diffusions FD1-1 and FD2-1, respectively. Accordingly, the area of the diffusion region including source regions S3-1 and S3-2 and floating diffusions FD1-1 and FD2-1 can be reduced, and the capacity of the diffusion region can be reduced. As a result, the conversion gain in the floating diffusion can be increased. In addition, low noise can be improved.

Now, the circuit configuration of the solid-state image pickup device according to the second embodiment is described.

Figure 6:
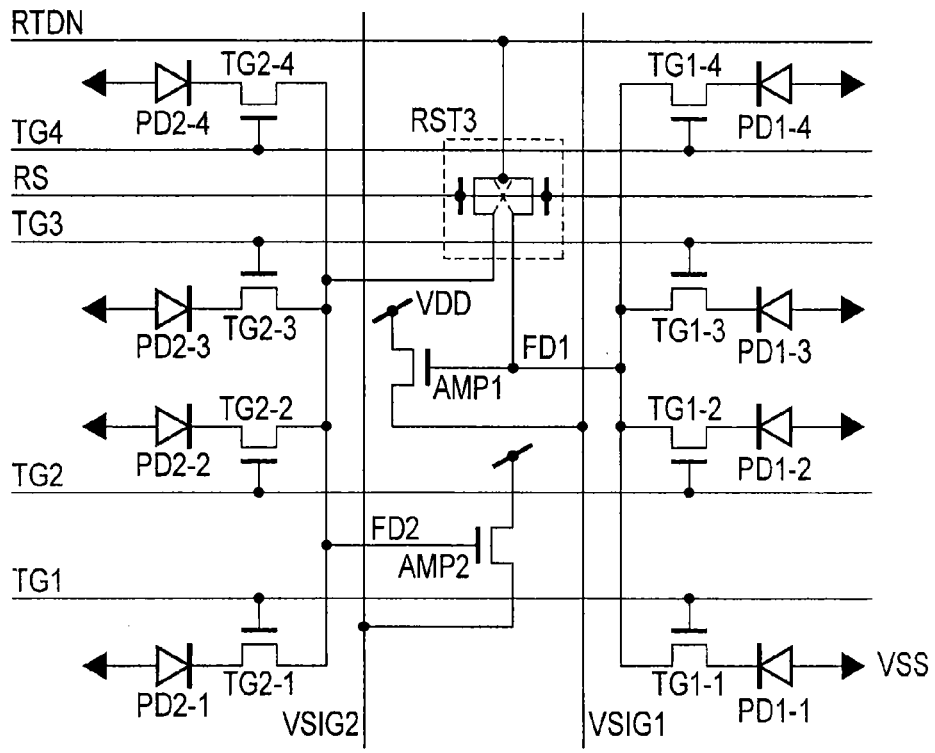
FIG. 6 is a circuit diagram of the solid-state image pickup device according to the second embodiment.

FIG. 6 is a circuit diagram of the solid-state image pickup device according to the second embodiment.

The cathode of photodiode PD1-1 is connected to floating diffusion FD1 (FD1-1 and FD1-2) via the current path of transfer transistor TG1-1. The cathode of photodiode PD1-2 is connected to floating diffusion FD1 via the current path of transfer transistor TG1-2. The cathode of photodiode PD1-3 is connected to floating diffusion FD1 via the current path of transfer transistor TG1-3. The cathode of photodiode PD1-4 is connected to floating diffusion FD1 via the current path of transfer transistor TG1-4.

Floating diffusion FD1 is in a floating state when transfer transistors TG1-1 to TG1-4 and reset transistor RST3 are off.

Floating diffusion FD1 is connected to the gate of amplifier transistor AMP1 and to one end of the current path of reset transistor RST3. The other end of the current path of reset transistor RST3 is connected to a signal line RTDN. One end of the current path of amplifier transistor AMP1 is connected to a signal line VSIG1. Moreover, the other end of the current path of amplifier transistor AMP1 is connected to a power supply voltage VDD.

The gates of transfer transistors TG1-1, TG1-2, TG1-3, and TG1-4 are connected to signal lines TG1, TG2, TG3, and TG4, respectively. A signal line RS is connected to the gate of reset transistor RST3. Moreover, a reference potential, for example, a ground potential Vss is supplied to the anodes of photodiodes PD1-1, PD1-2, PD1-3, and PD1-4.

The cathode of photodiode PD2-1 is connected to floating diffusion FD2 (FD2-1 and FD2-2) via the current path of transfer transistor TG2-1. The cathode of photodiode PD2-2 is connected to floating diffusion FD2 via the current path of transfer transistor TG2-2. The cathode of photodiode PD2-3 is connected to floating diffusion FD2 via the current path of transfer transistor TG2-3. The cathode of photodiode PD2-4 is connected to floating diffusion FD2 via the current path of transfer transistor TG2-4.

Floating diffusion FD2 is in a floating state when transfer transistors TG2-1 and TG2-4 and reset transistor RST3 are off.

Floating diffusion FD2 is connected to the gate of amplifier transistor AMP2 and to one end of the current path of reset transistor RST3. The other end of the current path of reset transistor RST3 is connected to signal line RTDN. One end of the current path of amplifier transistor AMP2 is connected to a signal line VSIG2. Moreover, the other end of the current path of amplifier transistor AMP2 is connected to a power supply voltage VDD.

The gates of transfer transistors TG2-1, TG2-2, TG2-3, and TG2-4 are connected to signal lines TG1, TG2, TG3, and TG4, respectively. Moreover, a reference potential, for example, a ground potential Vss is supplied to the anodes of photodiodes PD2-1, PD2-2, PD2-3, and PD2-4.

Now, the reset transistor in the solid-state image pickup device according to the second embodiment is described in detail.

Figure 7:
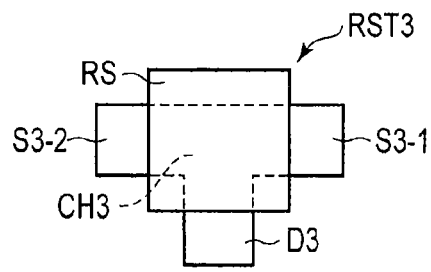
FIG. 7 is a layout diagram of a reset transistor in the solid-state image pickup device according to the second embodiment.
Figure 8:
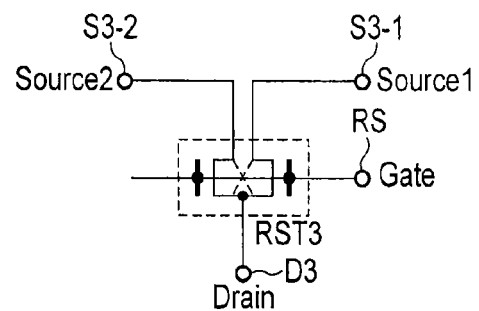
FIG. 8 is a circuit diagram of the reset transistor in the solid-state image pickup device according to the second embodiment.

FIG. 7 is a layout diagram of reset transistor RST3, and FIG. 8 is a circuit diagram of reset transistor RST3.

In the active area of the semiconductor substrate, source regions S3-1 and S3-2, drain region D3, and a channel region CH3 between source regions S3-1 and S3-2 and drain region D3 are T-shaped, as shown in FIG. 7. Moreover, signal line RS as a gate electrode is disposed on channel region CH3.

The circuit diagram of reset transistor RST3 in which source regions S3-1 and S3-2, channel region CH3, and drain region D3 are thus formed in the T-shape is shown in FIG. 8. The circuit diagram of reset transistor RST3 includes two source regions and two channel regions, in contrast with a normal transistor. Although the drain region is shared and two source regions are provided, reset transistor RST3 is similar in function to the normal transistor.

The advantageous effects of the solid-state image pickup device according to the second embodiment are described below in detail.

According to the second embodiment, the source regions, the channel region, and the drain region of the reset transistor are formed in the T-shape so that the two source regions of the reset transistor are shared with the two floating diffusions. Accordingly, the area of the diffusion region including the source regions and the floating diffusions can be reduced, and the capacity of the diffusion region can be reduced. As a result, the conversion gain in the floating diffusion can be increased. In addition, low noise can be improved.

Furthermore, the source regions are shared with the floating diffusions, and it is thereby possible to eliminate the source region disposed in the region that faces the drain region across the gate electrode. The region in which this source region has been formed is used to form the amplifier transistor so that the gate length of the amplifier transistor is greater. This can reduce the random noise of a signal charge output from the amplifier transistor.

Third Embodiment

In the second embodiment described above, the active region of the reset transistor is T-shaped. In the example described in the third embodiment, an active region of a reset transistor is cross-shaped.

Figure 9:
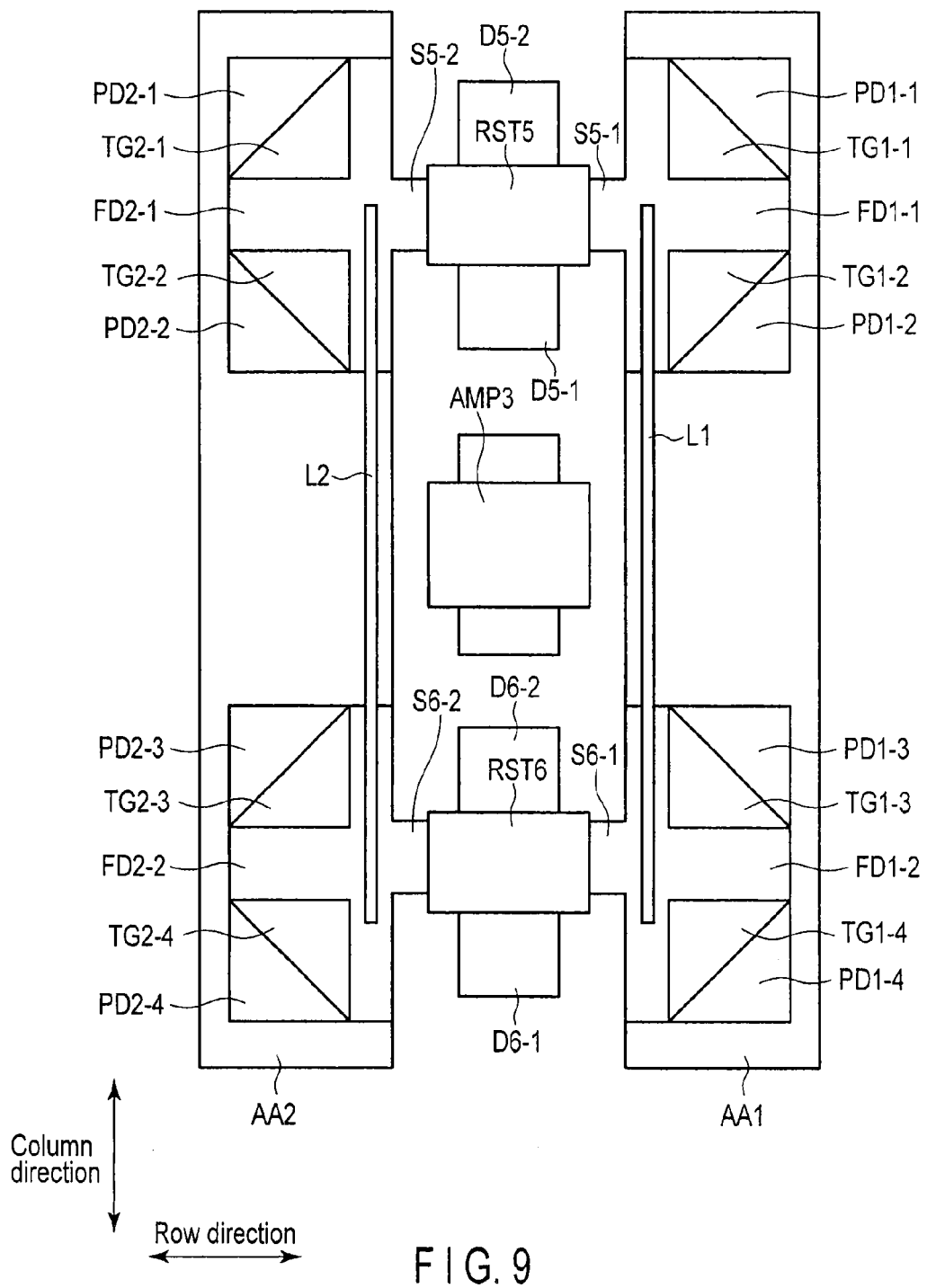
FIG. 9 is a layout diagram showing the configuration of a solid-state image pickup device according to a third embodiment.

FIG. 9 is a layout diagram showing the configuration of a solid-state image pickup device according to the third embodiment.

As shown, active areas AA1 and AA2 are disposed on a semiconductor substrate. First and second cell units are formed in active areas AA1 and AA2.

The first cell unit includes photodiodes PD1-1, PD1-2, PD1-3, and PD1-4, transfer transistors TG1-1, TG1-2, TG1-3, and TG1-4, an amplifier transistor AMP1, reset transistors RST5 and RST6, and floating diffusions FD1-1 and FD1-2.

The first cell unit has the following configuration. Photodiodes PD1-1 and PD1-2 are disposed in a column direction in active area AA1. Transfer transistor TG1-1 is disposed in the vicinity of photodiode PD1-1. Transfer transistor TG1-2 is disposed in the vicinity of photodiode PD1-2. Moreover, floating diffusion FD1-1 is disposed between transfer transistors TG1-1 and TG1-2.

Reset transistor RST5 is disposed in the vicinity of floating diffusion FD1-1 in a row direction. An amplifier transistor AMP3 is disposed in the vicinity of reset transistor RST5 in the column direction.

Photodiodes PD1-3 and PD1-4 are disposed in the column direction of photodiode PD1-2. Transfer transistor TG1-3 is disposed in the vicinity of photodiode PD1-3. Transfer transistor TG1-4 is disposed in the vicinity of photodiode PD1-4. Moreover, floating diffusion FD1-2 is disposed between transfer transistors TG1-3 and TG1-4.

An interconnect L1 is disposed between floating diffusions FD1-1 and FD1-2 to connect these floating diffusions.

The second cell unit is disposed in the row direction of the first cell unit. The second cell unit includes photodiodes PD2-1, PD2-2, PD2-3, and PD2-4, transfer transistors TG2-1, TG2-2, TG2-3, and TG2-4, an amplifier transistor AMP4, reset transistors RST5 and RST6, and floating diffusions FD2-1 and FD2-2. Amplifier transistor AMP4 is not shown.

The second cell unit has the following configuration. Photodiodes PD2-1 and PD2-2 are disposed in the column direction in active area AA2. Transfer transistor TG2-1 is disposed in the vicinity of photodiode PD2-1. Transfer transistor TG2-2 is disposed in the vicinity of photodiode PD2-2. Moreover, floating diffusion FD2-1 is disposed between transfer transistors TG2-1 and TG2-2.

The above-mentioned reset transistor RST5 is disposed in the vicinity of floating diffusion FD2-1 in the row direction. That is, reset transistor RST5 is disposed between floating diffusion FD1-1 and floating diffusion FD2-1.

Source regions S5-1 and S5-2 and drain regions D5-1 and D5-2 of reset transistor RST5, and its channel region between source regions S5-1 and S5-2 and drain regions D5-1 and D5-2 are formed in a cross-shape. Source region S5-1 is connected to floating diffusion FD1-1, and source region S5-2 is connected to floating diffusion FD2-1. Source region S5-1 is shared with floating diffusion FD1-1, and source region S5-2 is shared with floating diffusion FD2-1. That is, source region S5-1 and floating diffusion FD1-1 are formed from a common diffusion region, and source region S5-2 and floating diffusion FD2-1 are formed from a common diffusion region.

Source regions S5-1 and S5-2 of reset transistor RST5 are disposed to face each other across the gate of reset transistor RST5. Drain regions D5-1 and D5-2 of reset transistor RST5 are disposed to face each other across the gate of reset transistor RST5. Further, a straight line that connects source regions S5-1 and S5-2 of reset transistor RST5, and a straight line that connects drain regions D5-1 and D5-2 form a cross-shape.

Photodiodes PD2-3 and PD2-4 are disposed in the column direction of photodiode PD2-2. Transfer transistor TG2-3 is disposed in the vicinity of photodiode PD2-3. Transfer transistor TG2-4 is disposed in the vicinity of photodiode PD2-4. Moreover, floating diffusion FD2-2 is disposed between transfer transistors TG2-3 and TG2-4.

An interconnect L2 is disposed between floating diffusions FD2-1 and FD2-2 to connect these floating diffusions.

The above-mentioned reset transistor RST6 is disposed in the vicinity of floating diffusion FD2-2 in the row direction. That is, reset transistor RST6 is disposed between floating diffusion FD1-2 and floating diffusion FD2-2.

Source regions S6-1 and S6-2 and drain regions D6-1 and D6-2 of reset transistor RST6, and its channel region between source regions S6-1 and S6-2 and drain regions D6-1 and D6-2 are formed in a cross-shape. Source region S6-1 is connected to floating diffusion FD1-2, and source region S6-2 is connected to floating diffusion FD2-2. Source region S6-1 is shared with floating diffusion FD1-2, and source region S6-2 is shared with floating diffusion FD2-2. That is, source region S6-1 and floating diffusion FD1-2 are formed from a common diffusion region, and source region S6-2 and floating diffusion FD2-2 are formed from a common diffusion region.

Source regions S6-1 and S6-2 of reset transistor RST6 are disposed to face each other across the gate of reset transistor RST6. Drain regions D6-1 and D6-2 of reset transistor RST6 are disposed to face each other across the gate of reset transistor RST6. Further, a straight line that connects source regions S6-1 and S6-2 of reset transistor RST6, and a straight line that connects drain regions D6-1 and D6-2 form a cross-shape.

Interconnect L2 is disposed between floating diffusion FD2-1 and floating diffusion FD2-2 to connect these floating diffusions.

Now, the circuit configuration of the solid-state image pickup device according to the third embodiment is described.

FIG. 10 is a circuit diagram of the solid-state image pickup device according to the third embodiment.

The cathode of photodiode PD1-1 is connected to floating diffusion FD1 (FD1-1 and FD1-2) via the current path of transfer transistor TG1-1. The cathode of photodiode PD1-2 is connected to floating diffusion FD1 via the current path of transfer transistor TG1-2. The cathode of photodiode PD1-3 is connected to floating diffusion FD1 via the current path of transfer transistor TG1-3. The cathode of photodiode PD1-4 is connected to floating diffusion FD1 via the current path of transfer transistor TG1-4.

Floating diffusion FD1 is in a floating state when transfer transistors TG1-1 to TG1-4 and reset transistors RST5 and RST6 are off.

Floating diffusion FD1 is connected to the gate of amplifier transistor AMP3 and to one end of the current path of reset transistors RST5 and RST6. The other end of the current path of reset transistors RST5 and RST6 is connected to a signal line RTDN. One end of the current path of amplifier transistor AMP3 is connected to a signal line VSIG1. Moreover, the other end of the current path of amplifier transistor AMP3 is connected to a power supply voltage VDD.

The gates of transfer transistors TG1-1, TG1-2, TG1-3, and TG1-4 are connected to signal lines TG1, TG2, TG3, and TG4, respectively. A signal line RS is connected to the gates of reset transistors RST5 and RST6. Moreover, a reference potential, for example, a ground potential Vss is supplied to the anodes of photodiodes PD1-1, PD1-2, PD1-3, and PD1-4.

The cathode of photodiode PD2-1 is connected to floating diffusion FD2 (FD2-1 and FD2-2) via the current path of transfer transistor TG2-1. The cathode of photodiode PD2-2 is connected to floating diffusion FD2 via the current path of transfer transistor TG2-2. The cathode of photodiode PD2-3 is connected to floating diffusion FD2 via the current path of transfer transistor TG2-3. The cathode of photodiode PD2-4 is connected to floating diffusion FD2 via the current path of transfer transistor TG2-4.

Floating diffusion FD2 is in a floating state when transfer transistors TG2-1 and TG2-4 and reset transistors RST5 and RST6 are off.

Floating diffusion FD2 is connected to amplifier transistor AMP4 and to one end of the current path of reset transistors RST5 and RST6. The other end of the current path of reset transistors RST5 and RST6 is connected to signal line RTDN. One end of the current path of amplifier transistor AMP4 is connected to a signal line VSIG2. Moreover, the other end of the current path of amplifier transistor AMP4 is connected to a power supply voltage VDD.

The gates of transfer transistors TG2-1, TG2-2, TG2-3, and TG2-4 are connected to signal lines TG1, TG2, TG3, and TG4, respectively. Moreover, a reference potential, for example, a ground potential Vss is supplied to the anodes of photodiodes PD2-1, PD2-2, PD2-3, and PD2-4.

Now, the reset transistor in the solid-state image pickup device according to the third embodiment is described in detail.

FIG. 11 is a layout diagram of the reset transistor, and FIG. 12 is a circuit diagram of the reset transistor. Although the layout and circuit diagram of reset transistor RST5 are described here, reset transistor RST6 only has different reference signs and is similar in configuration.

In the active area of the semiconductor substrate, source regions S5-1 and S5-2, drain regions D5-1 and D5-2, and a channel region CH5 between source regions S5-1 and S5-2 and drain regions D5-1 and D5-2 are cross-shaped, as shown in FIG. 11. That is, source regions S5-1 and S5-2 are disposed to face each other across the gate, and drain regions D5-1 and D5-2 are disposed to face each other across the gate. Source regions S5-1 and S5-2 and drain regions D5-1 and D5-2 are disposed to intersect at right angles with each other.

As described above, source region S5-1 is shared with floating diffusion FD1-1, and source region S5-2 is shared with floating diffusion FD2-1. Moreover, signal line RS as a gate electrode is disposed on channel region CH5.

The circuit diagram of reset transistor RST5 in which source regions S5-1 and S5-2, channel region CH5, and drain regions D5-1 and D5-2 are thus formed in a cross-shape is shown in FIG. 12. The circuit diagram of reset transistor RST5 includes two source regions, two drain regions, two gates, and two channel regions, in contrast with a normal transistor. Although two source regions and two drain regions are provided, reset transistor RST5 is similar in function to the normal transistor.

According to the third embodiment, drain region D5-2 (or D6-2) is also formed in the region that faces drain region D5-1 (or D6-1) across the gate electrode. Consequently, reset transistor RST5 (or RST6) can be symmetrical in the row direction and the column direction, that is, can be horizontally and vertically symmetrical, so that a transistor having the same configuration can be disposed in each pixel. This can reduce pixel-to-pixel output characteristic variation.

As described above, according to the embodiments, it is possible to provide a solid-state image pickup device that can fulfill pixel characteristics even if pixels are miniaturized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state image pickup device comprising:
   a first photoelectric converter which is formed on a semiconductor substrate and which coverts incident light to a signal charge;
   a transfer transistor which is formed on the semiconductor substrate and which transfers the signal charge converted by the first photoelectric converter;
   a first floating diffusion layer which is formed on the semiconductor substrate and which stores the signal charge transferred by the transfer transistor;
   a reset transistor which is formed on the semiconductor substrate and which resets the signal charge stored in the first floating diffusion layer; and
   an amplifier transistor which is formed on the semiconductor substrate and which amplifies the signal charge stored in the first floating diffusion layer,
   wherein a source region and a drain region of the reset transistor, and its channel region between the source region and the drain region are formed in an L-shape on the semiconductor substrate.

2. The solid-state image pickup device according to claim 1, wherein the source region of the reset transistor and the first floating diffusion layer are formed from a common diffusion region.

3. The solid-state image pickup device according to claim 1, further comprising a second photoelectric converter which coverts incident light to a signal charge,
   wherein the first photoelectric converter and the second photoelectric converter hold the first floating diffusion layer therebetween.

4. The solid-state image pickup device according to claim 1, further comprising:
   third and fourth photoelectric converters which covert incident light to signal charges; and
   a second floating diffusion layer held between the third photoelectric converter and the fourth photoelectric converter,
   wherein the second floating diffusion layer is electrically connected to the first floating diffusion layer.

* * * * *